United States Patent
Drane et al.

(10) Patent No.: US 10,175,943 B2
(45) Date of Patent: Jan. 8, 2019

(54) SORTING NUMBERS IN HARDWARE

(71) Applicant: Imagination Technologies Limited, Kings Langley (GB)

(72) Inventors: Theo Alan Drane, London (GB); Thomas Michael Rose, Hertfordshire (GB)

(73) Assignee: Imagination Technologies Limited, Kings Langley (GB)

(*) Notice: Subject to any disclaimer, the term of this patent is extended or adjusted under 35 U.S.C. 154(b) by 0 days.

(21) Appl. No.: 15/497,373

(22) Filed: Apr. 26, 2017

(65) Prior Publication Data
US 2017/0308354 A1 Oct. 26, 2017

(30) Foreign Application Priority Data

Apr. 26, 2016 (GB) .................................. 1607244.9

(51) Int. Cl.
| G06F 7/26 | (2006.01) |
| H03K 19/177 | (2006.01) |
| H03K 19/21 | (2006.01) |
| G06F 7/24 | (2006.01) |

(52) U.S. Cl.
CPC .................. *G06F 7/26* (2013.01); *G06F 7/24* (2013.01); *H03K 19/17724* (2013.01); *H03K 19/21* (2013.01)

(58) Field of Classification Search
CPC ..... G06F 7/26; H03K 19/17724; H03K 19/21
USPC ............................... 708/207, 671; 340/146.2
See application file for complete search history.

(56) References Cited

U.S. PATENT DOCUMENTS

| 3,740,538 | A | * | 6/1973 | Hemphill | G06F 7/24 340/146.2 |
| 4,225,849 | A | * | 9/1980 | Lai | G06F 7/026 340/146.2 |
| 4,935,719 | A | * | 6/1990 | McClure | G06F 7/026 340/146.2 |
| 5,227,678 | A | * | 7/1993 | Han | G06F 7/544 326/21 |
| 5,986,538 | A | * | 11/1999 | Yoon | G06F 7/026 326/52 |
| 6,014,074 | A | * | 1/2000 | Park | G06F 7/026 340/146.2 |
| 2002/0083108 | A1 | * | 6/2002 | Tierno | G06F 7/026 708/671 |
| 2003/0023654 | A1 | * | 1/2003 | Pascucci | G06F 7/026 708/671 |

FOREIGN PATENT DOCUMENTS

| EP | 0319421 A | 6/1989 |
| JP | H11-102284 A | 4/1999 |

* cited by examiner

*Primary Examiner* — Tan V Mai
(74) *Attorney, Agent, or Firm* — Vorys, Sater, Seymour and Pease LLP; Vincent M DeLuca

(57) ABSTRACT

An efficient hardware apparatus for calculating the maximum and/or minimum of two n-bit binary input values generates a number of separate select signals, each of which is then used to control the selection of a single bit from one of the two binary inputs. A select signal for an $i^{th}$ bit of the output depends upon bits $[n-1, i]$ in each of the two binary inputs and based on the select signal the $i^{th}$ bit is selected from one of the two inputs.

10 Claims, 14 Drawing Sheets

SORTING NUMBERS IN HARDWARE

BACKGROUND

There are many situations where hardware is required to sort two or more input binary numbers, i.e. to arrange them in order of size. Such sorters are typically constructed from a number of identical logic blocks as shown in FIG. 1. FIG. 1 shows a schematic diagram of an example hardware arrangement 100 for sorting 4 inputs, $x_1$, $x_2$, $x_3$, $x_4$ into size order, i.e. such that output$_1$≥output$_2$≥output$_3$≥output$_4$. It can be seen that this sorter 100 comprises 5 identical logic blocks 102 each of which outputs the largest and smallest (i.e. max and min) values of two inputs (which may be denoted a and b).

Each of the logic blocks 102 receives two n-bit integer inputs (a, b) and comprises a comparator that returns a Boolean that indicates whether a>b. The output of the comparator, which may be referred to as the 'select' signal, is then used to control a plurality of n-bit wide multiplexers that each choose between n-bits from a or n-bits from b. If the logic block 102 outputs both the maximum and minimum values (from a and b, as shown in the examples in FIG. 1), the select signal is used to control the multiplexing of 2n-bits (e.g. in the form of 2n 1-bit wide multiplexers or two n-bit wide multiplexers). Alternatively, if the logic block has only one output (which is either the maximum or minimum of a and b), the select signal is used to control the multiplexing of n-bits (e.g. in the form of n 1-bit wide multiplexers or one n-bit wide multiplexer).

In the arrangement described above, the select signal is used to power a plurality of logic elements (e.g. logic gates) within a logic block 102 and this results in a large propagation delay. This effect of a delay is caused by a single gate output wire having to charge the transistors in a large number of gates (before these latter gates can propagate their outputs) is called 'fanout'. Whilst this delay may be acceptable when only sorting two input numbers, where these logic blocks 102 are concatenated (e.g. as in the sorter 100 shown in FIG. 1 or larger sorters for more than 4 inputs) the resulting delay of the sorting circuit increases which may seriously impact performance (e.g. it may result in the sorting process taking more than a single clock cycle).

A solution to this delay is to include a large number of buffers (e.g. at least n buffers, which may be arranged in a tree structure) with each of the buffers being driven by the select signal; however, this results in a hardware arrangement that is significantly larger (e.g. in terms of area of logic).

The embodiments described below are provided by way of example only and are not limiting of implementations which solve any or all of the disadvantages of known sorters.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An efficient hardware apparatus for calculating the maximum and/or minimum of two n-bit binary input values is described. The hardware apparatus generates a number of separate select signals, each of which is then used to control the selection of a single bit from one of the two binary inputs. A select signal for an $i^{th}$ bit of the output depends upon bits [n−1, i] in each of the two binary inputs and based on the select signal the $i^{th}$ bit is selected from one of the two inputs.

A first aspect provides a hardware arrangement arranged to receive first and second n-bit input values and output an n-bit maximum value and/or an n-bit minimum value selected from the two input values, the hardware arrangement comprising: a plurality of logic blocks arranged to separately select a plurality of different, non-overlapping proper subsets of adjacent bits of the n bits of an output value from the first and second input values.

A second aspect provides a method comprising: receiving two n-bit input values; generating a plurality of select signals in hardware logic, wherein a select signal is generated by comparing a different proper subset of adjacent bits from each of the input values; using each select signal to select, in hardware logic, a different, non-overlapping proper subset of adjacent bits from one of the input values to form at least one output value; outputting the at least one output value, wherein the at least one output value comprises an n-bit maximum value and/or an n-bit minimum value selected from the two n-bit input values.

The max/min logic block described herein may be embodied in hardware on an integrated circuit. There may be provided a method of manufacturing, at an integrated circuit manufacturing system, a max/min logic block as described herein. There may be provided an integrated circuit definition dataset that, when processed in an integrated circuit manufacturing system, configures the system to manufacture a max/min logic block as described herein. There may be provided a non-transitory computer readable storage medium having stored thereon a computer readable description of an integrated circuit that, when processed, causes a layout processing system to generate a circuit layout description used in an integrated circuit manufacturing system to manufacture a max/min logic block as described herein.

There may be provided an integrated circuit manufacturing system comprising: a non-transitory computer readable storage medium having stored thereon a computer readable integrated circuit description that describes the max/min logic block as described herein; a layout processing system configured to process the integrated circuit description so as to generate a circuit layout description of an integrated circuit embodying the max/min logic block as described herein; and an integrated circuit generation system configured to manufacture the max/min logic block as described herein according to the circuit layout description.

There may be provided computer program code for performing a method as described herein. There may be provided non-transitory computer readable storage medium having stored thereon computer readable instructions that, when executed at a computer system, cause the computer system to perform the method as described herein.

The above features may be combined as appropriate, as would be apparent to a skilled person, and may be combined with any of the aspects of the examples described herein.

BRIEF DESCRIPTION OF THE DRAWINGS

Examples will now be described, in detail, with reference to the accompanying drawings, in which.

Figure 1:
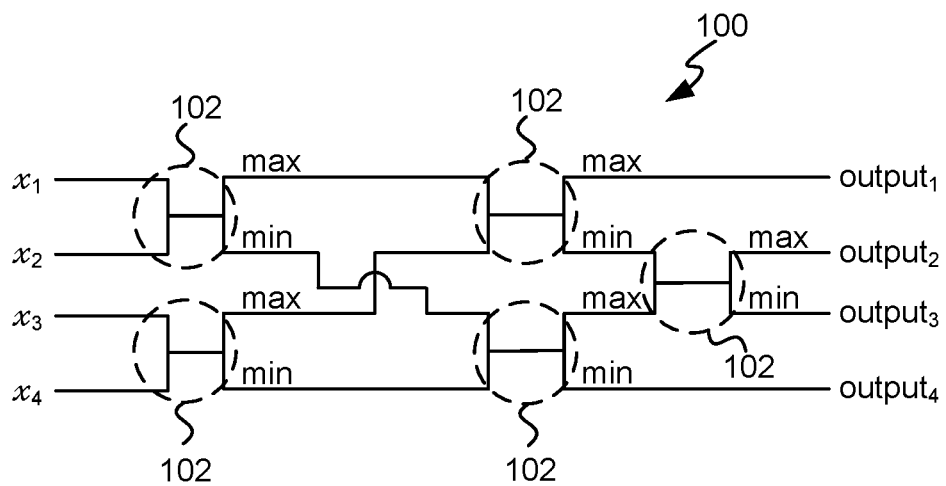
FIG. 1 is a schematic diagram of an example hardware arrangement for sorting 4 inputs.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only. In describing the various embodiments and examples, the following notation is used:

$z[i]$ is used to refer to the $i^{th}$ bit of a binary value z, the value z may be an input, output or an intermediate value generated by the hardware logic described below, i may be referred to as the bit index and has a value between 0 and n−1, n is the number of bits (i.e. the bit width) of a value or signal, and for an n-bit binary value, $z[n-1]$ is the most significant bit (MSB) and $z[0]$ is the least significant bit (LSB).

As described above, in a known hardware apparatus for calculating the maximum and/or minimum of two numbers (e.g. logic block 102), a single select signal is used to control a plurality of logic gates which leads to increased propagation delay. This delay becomes more significant when multiple of such logic blocks are combined in a sorter (e.g. as shown in FIG. 1) or other hardware arrangement which outputs the maximum and/or minimum of more than two input numbers.

Described herein is an efficient hardware apparatus for calculating the maximum and/or minimum of two n-bit binary inputs (referred to herein as a 'max/min logic block'). These two binary inputs may be signed or unsigned integers or may be signed or unsigned real numbers or floating point inputs. In examples where the two binary inputs are not integers, the two inputs have the binary point in the same place. In examples where the two binary inputs are floating point inputs, the two inputs have the same number of exponent bits.

As described in more detail below, instead of generating a single select signal which is then used to feed multiple logic gates, the max/min logic block generates a plurality of separate select signals $s[i]$ (e.g. n or n−1 separate select signals) each of which may control the selection of a single bit ($a[i]$ or $b[i]$) from one of the two binary inputs (a and b), i.e. depending upon the value of $s[i]$, bit $max[i]$ in a maximum output is equal to $a[i]$ or $b[i]$ and bit $min[i]$ in a minimum output is equal to $b[i]$ or $a[i]$ and as described above the max/min logic block may output either or both of the maximum and minimum outputs. Alternatively, a plurality of separate select signals may be generated each of which controls the selection of multiple adjacent bits (i.e. such that fewer than n or n−1 select signals are generated), e.g. the inputs may be split into adjacent pairs of bits and then the method may be implemented for pairs of bits instead of single bits.

To generate the plurality of select signals $s[i]$, the max/min logic block generates 2n or 2n−1 initial signals, each of which are either high or low (e.g. 1 or 0). These initial signals comprise n initial signals that indicate whether, for each of the n bits of the inputs a and b, $a[i]>b[i]$ and a further n or n−1 initial signals that indicate whether, for each of bits i=n−1 to i=1 of the inputs a and b and optionally also for bit i=0, $a[i]=b[i]$. These 2n or 2n−1 initial signals, each of which is generated from only a single bit from each of the inputs a and b, are then combined in a number of hardware logic stages to generate further signals (which may be referred to as intermediate signals) that relate to more bits of each of the inputs a and b until at least one signal is generated that relates to all of the bits of the inputs a and b.

A select signal $s[i]$ depends upon bits $a[n-1, i]$ and $b[n-1, i]$. The select signal, $s[n-1]$, for the MSB of the output(s) ($max[n-1]$ and/or $min[n-1]$), therefore depends only upon bits $a[n-1]$ and $b[n-1]$. Consequently, the MSB of the output(s) ($max[n-1]$ and/or $min[n-1]$) may be generated ahead of the less significant bits (which have select signals that depend upon multiple bits from each of the inputs). The select signal for the LSB ($s[0]$) is generated last as it depends upon all the bits in the inputs ($a[n-1,0]$ and $b[n-1,0]$), although it may be generated at the same time as the select signals for other more significant bits (e.g. as shown in the example in FIG. 5). Consequently the LSB of the outputs(s) ($max[0]$ and/or $min[0]$) may be generated last.

As described in more detail below, a plurality (i.e. n−1) of the subsequently generated (or intermediate) signals are used as select signals $s[i]$ for all the bits of the output(s) except for the MSBs. One of the n initial signals may be used as the select signal $s[n-1]$ for the MSBs ($max[n-1]$ and/or $min[n-1]$). Alternatively, the select signal may be generated in a different way from $a[n-1]$ and $b[n-1]$ or no specific select signal may be generated for the MSB (i.e. only n−1 select signals are generated) and instead the MSBs of the output(s) may be generated directly from the MSBs of the two inputs (i.e. a[n−1] and b[n−1]).

As more than one select signal (s[i]) is generated in the max/min logic units described herein and they are not generated all at the same time, the resultant delay profile (for the output bits) may be non-linear and is different to known hardware apparatus where all output bits arrive at the same time.

Figure 7:
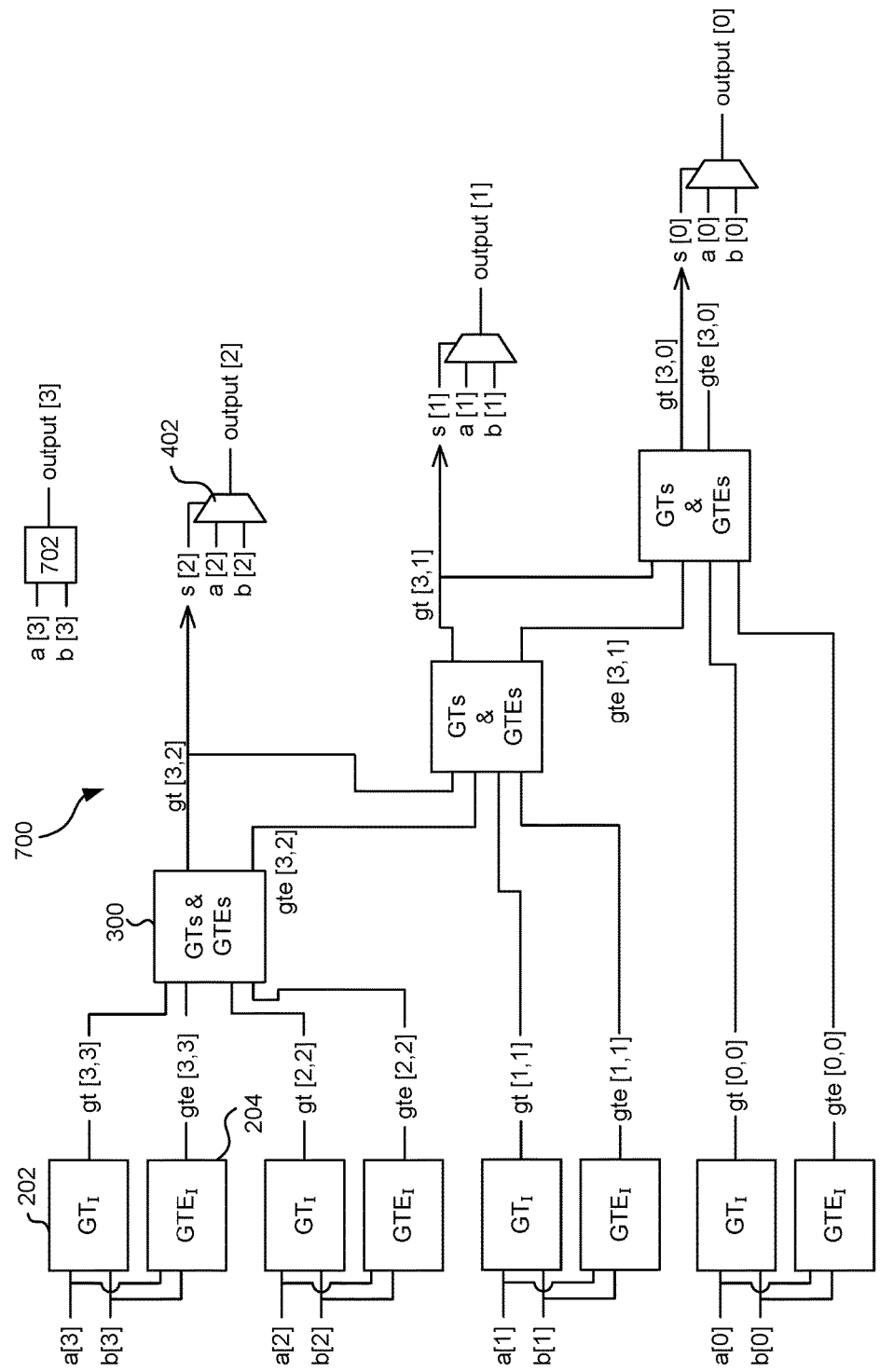
FIG. 7 shows a second example max/min logic block comprising a sequential arrangement of the logic blocks shown in FIG. 3.
Figure 8:
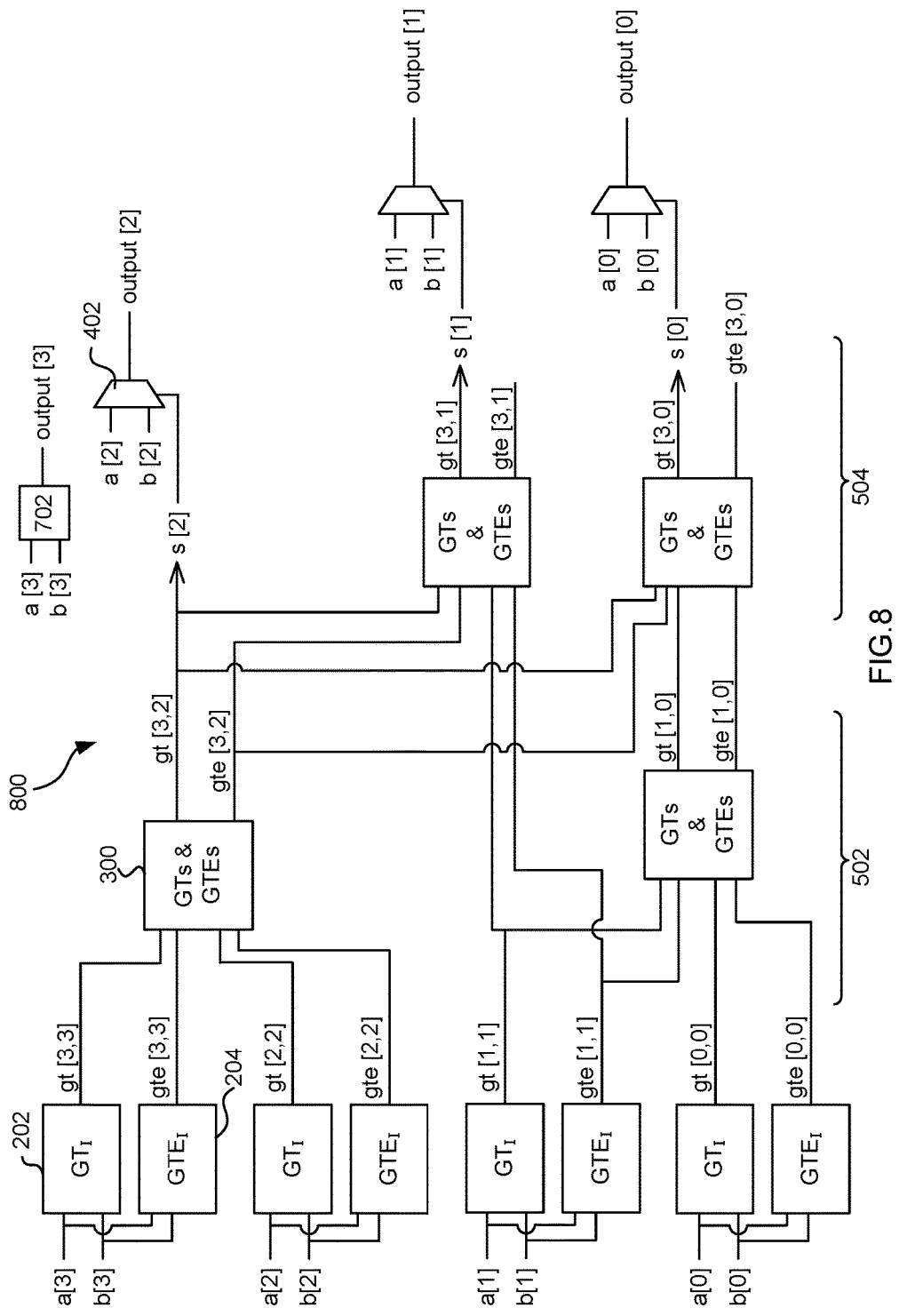
FIG. 8 shows a second example max/min logic block comprising a logarithmic arrangement of the logic blocks shown in FIG. 3.
Figure 12:
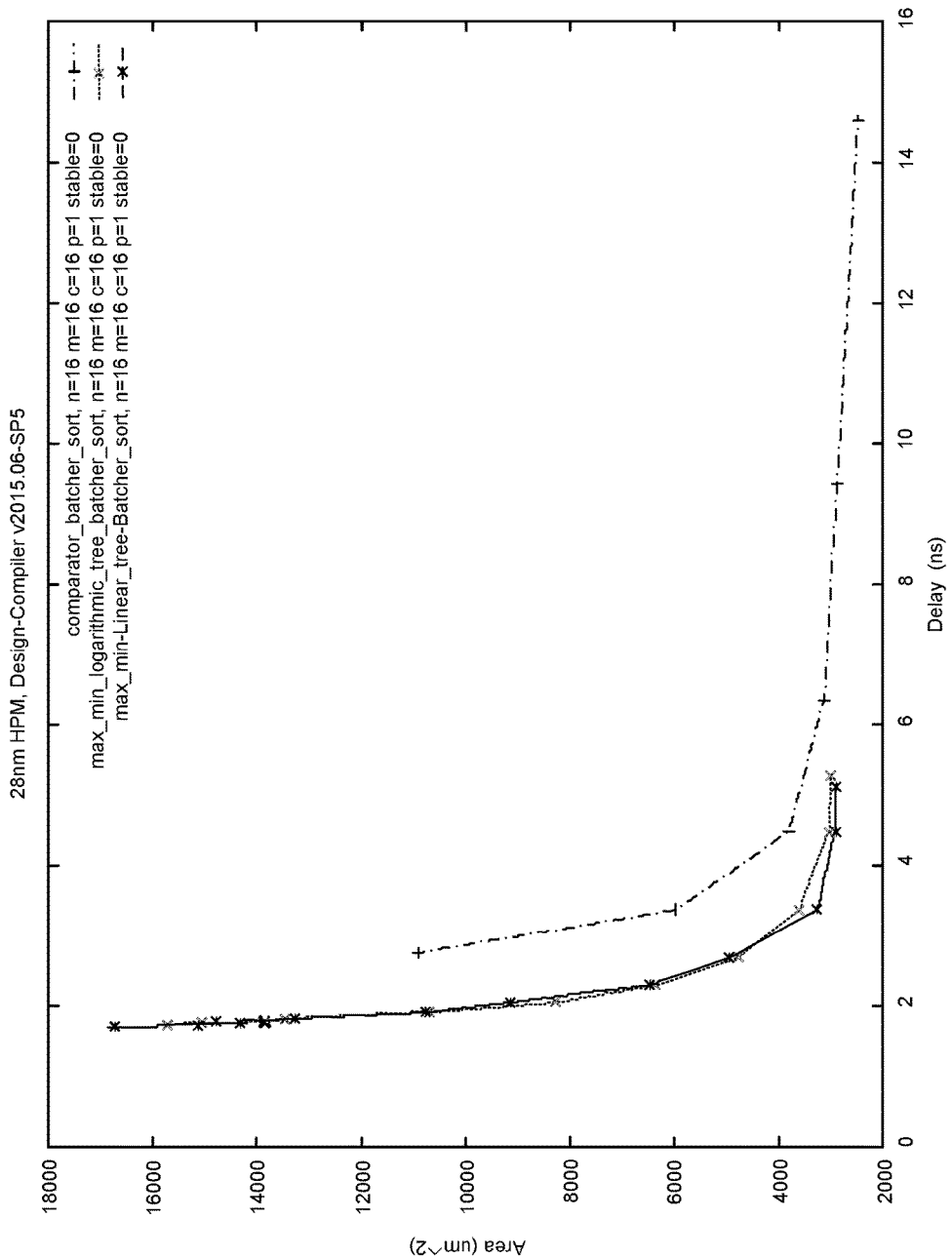
FIG. 12 shows an example of the results that can be achieved using the hardware arrangements described herein.

The hardware apparatus described herein therefore provides an increase in speed (i.e. reduction in delay) in particular for the MSBs of the maximum and/or minimum outputs (although there is no reduction in delay for the LSBs). Where multiple of these max/min logic blocks are combined sequentially, for example into a sorter (e.g. where 5 are combined to replicate the sorter shown in FIG. 1 or 63 are combined to sort 16 numbers in an arrangement known as the batcher odd-even merge sort), the combination is faster than using the known hardware or is smaller in size for the same speed of operation. FIG. 12 shows an example area delay curve showing a comparison of a max/min logic block comprising a sequential tree of logic elements (as shown in FIG. 7 and labeled 'max_min_linear_tree_batcher_sort design' in FIG. 12) and a max/min logic block comprising a logarithmic tree of logic elements (as shown in FIG. 8 and labeled 'max_min_logarithmic_tree_batcher_sort design' in FIG. 12) against a logic block comprising of a known arrangement (labeled 'comparator_batcher_sort design' in FIG. 12). This known arrangement comprises a comparator generating a select signal (as described above and shown in FIG. 1). In each case, the max/min logic blocks are arranged into a batcher odd-even merge sorting network for sorting 16 unsigned 16-bit values (63 max/min logic blocks with a maximum sequential depth of 10 blocks from inputs to outputs). These results show an increase in speed of about 38% and up to a 45% area reduction. Further overall speed increases may be achieved where the delay profile of the max/min logic blocks (or a sorter comprising a plurality of these max/min logic blocks) is the inverse (or approximately the inverse) of the delay profile of a subsequent logic block, e.g. if a sorter using the max/min logic blocks described herein (and hence which outputs the MSBs first) provides input(s) to a sequential division logic block (which operates on the MSBs first).

The initial description below assumes that the inputs a and b are unsigned. Subsequent description shows how the hardware may be modified to work with signed inputs.

The generation of the 2n or 2n−1 initial signals can be described with reference to FIG. 2. As noted above, each initial signal is generated from two bits, one from each of the two inputs, with the same bit index, i, and there are two types of logic element 202, 204 (labeled $GT_I$ and $GTE_I$ respectively) used to generate these initial signals. A max/min logic block comprises n $GT_I$ logic blocks 202 and n $GTE_I$ logic blocks 204.

The first type of logic element 202 (labeled $GT_I$) is used to generate initial signals gt[i, i] that indicate whether, for each of the n bits of the inputs a and b, a[i]>b[i]. The signal gt[i, i] has two possible values, high (or 1) and low (or 0) and for the purposes of the following description it is assumed that the value of gt[i, i] is high if a[i]>b[i], although it will be appreciated that the hardware may also be implemented with the value of gt[i, i] being low if a[i]>b[i]. As also shown in FIG. 2, a $GT_I$ logic element 202 comprises a NOT gate (or inverter) 206 applied to the second of the two inputs b[i] and an AND gate 208 which receives the first of the two inputs a[i] and is connected to the output of the NOT gate 206. The operation of the $GT_I$ logic element 202 may be written in RTL as:

$$gt(i,i)<=a(i) \text{ and not } (b(i))$$

and the truth table is:

| INPUT | | OUTPUT |
|---|---|---|
| A | B | A AND NOT B |
| 0 | 1 | 0 |
| 0 | 0 | 0 |
| 1 | 1 | 0 |
| 1 | 0 | 1 |

The second type of logic element 204 (labeled $GTE_I$) is used to generate n or n−1 initial signals gte[i, i] that indicate whether, for each of the bits of the inputs a and b for n−1≥i≥1 and optionally also for the bit i=0, a[i]=b[i]. The signal gte[i, i] has two possible values, high (or 1) and low (or 0) and for the purposes of the following description it is assumed that the value of gte[i, i] is high indicates that a[i]=b[i], although it will be appreciated that the hardware may also be implemented with the value of gte[i, i] being low to indicate a[i]=b[i]. As also shown in FIG. 2, are two different implementations 204a, 204b of a $GTE_I$ logic element 204.

In the first implementation 204a, the signal gte[i, i] provides a strict indication of whether a[i]=b[i]. This implementation comprises a NOT gate (or inverter) 206 applied to the second of the two inputs b[i] and an XOR gate 210 which receives the first of the two inputs a[i] and is connected to the output of the NOT gate 206. The operation of the $GTE_I$ logic element 204a may be written in RTL as:

$$gte(i,i)<=a(i) \text{ xor not } (b(i))$$

and the truth table is:

| INPUT | | OUTPUT |
|---|---|---|
| A | B | A XOR NOT B |
| 0 | 1 | 0 |
| 0 | 0 | 1 |
| 1 | 1 | 1 |
| 1 | 0 | 0 |

Alternatively, it will be appreciated that an XNOR gate may be used instead of the combination of XOR and NOT gates.

In the second implementation 204b may be implemented in a smaller area because it uses an OR gate 212 instead of the XOR gate 210 and XOR gates are typically larger in area than an OR gate. This implementation comprises a NOT gate (or inverter) 206 applied to the second of the two inputs b[i] and an OR gate 212 which receives the first of the two inputs a[i] and is connected to the output of the NOT gate 206. The operation of the $GTE_I$ logic element 204b may be written in RTL as:

$$gte(i,i)<=a(i) \text{ or not } (b(i))$$

In this second implementation 204b, the signal gte[i, i] provides an indication of whether a[i]=b[i]; however it is not the strict indication as is the case in the first implementation 204a, as can be described with reference to the truth table:

| INPUT | | OUTPUT |
|---|---|---|
| A | B | A OR NOT B |
| 0 | 1 | 0 |
| 0 | 0 | 1 |
| 1 | 1 | 1 |
| 1 | 0 | 1 |

It can be seen from the truth table above, that gte[i, i] is high when a[i]=b[i] or when a[i]>b[i]. As gt[i, i] is also high when a[i]>b[i], gte[i, i] still provides indication of whether a[i]=b[i].

Figure 2:
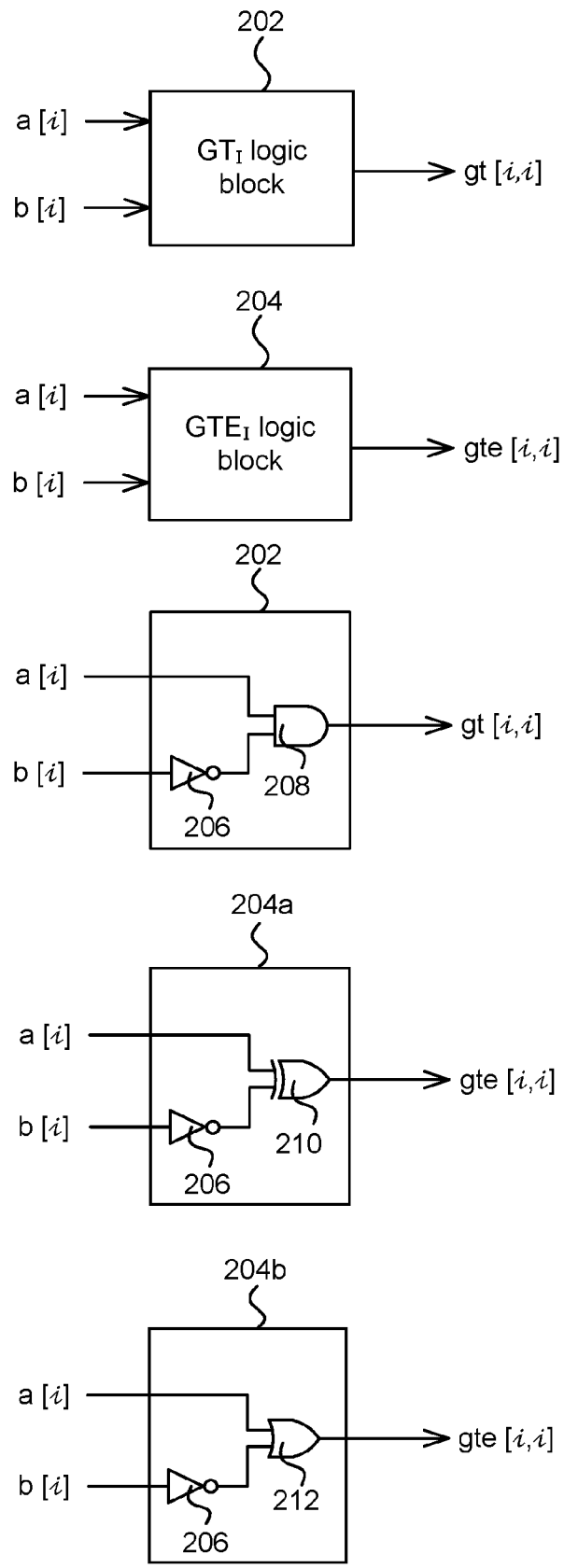
FIG. 2 shows schematic diagrams of various logic elements that may be used to generate initial signals from one bit from each of the two inputs.

Having generated the 2n or 2n−1 initial signals using the $GT_I$ and $GTE_I$ logic blocks 202, 204 (as shown in FIG. 2), the gt[i, i] and gte[i, i] signals are combined in a number of hardware logic stages to generate signals (i.e. intermediate signals) which relate to more bits of each of the inputs a and b until signals are generated which relate to all of the bits of the inputs a and b and in particular until select signals s[i] have been generated for each bit of the output(s). A select signal s[i] is given by:

$$s[i]=gt[n-1,i]$$

Figure 3:
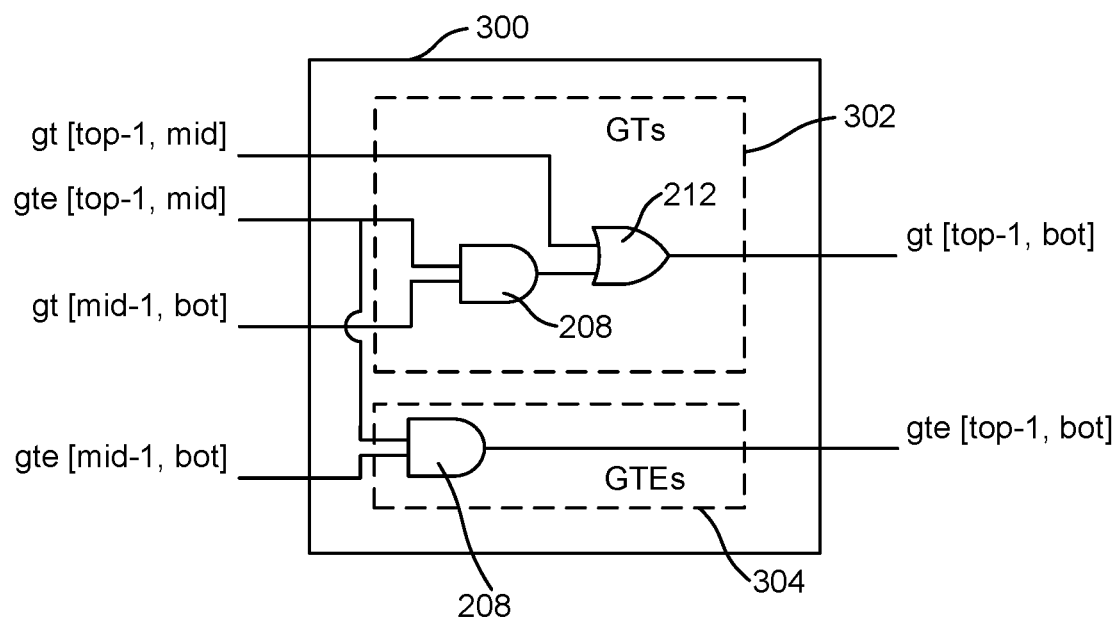
FIG. 3 shows schematic diagrams of logic elements that may be used to generate intermediate signals from initial signals or other intermediate signals.

FIG. 3 is a schematic diagram of a logic block 300 (labeled $GT_S$ & $GTE_S$) that is used in these subsequent hardware logic stages. Whilst this logic block 300 is shown as a single block to reduce the complexity of FIGS. 4 and 5, it may alternatively be shown as two logic blocks 302, 304 (as indicated by the dotted lines and labeled $GT_S$ and $GTE_S$ respectively). The two logic blocks 302, 304 are similar in function to the logic blocks 202, 204 described above in that the $GT_S$ logic block 302 generates a signal gt[top−1, bot] that indicates whether a[top−1, bot]>b[top−1, bot] and the $GTE_S$ logic block 304 generates a signal gte [top−1, bot] that indicates whether a[top−1, bot]=b[top−1, bot]; however, unlike the logic blocks 202, 204, the signals output by the $GT_S$ and $GTE_S$ logic blocks 302, 304 relate to two or more bits of each of the inputs a and b (depending upon the values of top and bot).

The $GT_S$ logic element 302 is used to generate intermediate signals gt[top−1, bot] that indicate whether a[top−1, bot]>b[top−1, bot], where top−1 and bot are two different bit indices (i.e. values of i) and top−1>bot. Consequently, the signal gt[top−1, bot] relates to two or more bits of each of the inputs a and b (depending upon the values of top and bot). The signal gt[top−1, bot] has two possible values, high (or 1) and low (or 0) and for the purposes of the following description it is assumed that the value of gt[top−1, bot] is high if a[top−1, bot]>b[top−1, bot], although it will be appreciated that the hardware may also be implemented with the value of gt[top−1, bot] being low if a[top−1, bot]>b[top−1, bot].

As shown in FIG. 3, a $GT_S$ logic element 302 receives three different inputs: gt[top−1, mid], gte [top−1, mid] and gt[mid−1, bot], where top−1, mid and bot are three bit indices (i.e. values of i, in the range 0 to n−1) and (top−1) ≥mid>bot. Consequently, any or all of gt[top−1, mid], gte [top−1, mid] and gt[mid−1, bot] may be initial signals (as generated using logic elements 202, 204), for example where top−1=mid and/or mid−1=bot. Similarly, any or all of gt[top−1, mid], gte [top−1, mid] and gt[mid−1, bot] may be intermediate signals (as generated using logic elements 302, 304 in a previous hardware logic stage), for example where top−1>mid and/or mid−1>bot.

As also shown in FIG. 3, a $GT_S$ logic element 302 comprises an AND gate 208 which receives two of the inputs gte [top−1, mid] and gt[mid−1, bot] and an OR gate 212 which receives the third of the inputs gt[top−1, mid] and is connected to the output of the AND gate 208. The operation of the $GT_S$ logic element 302 may be written in RTL as:

$$gt(\text{top}-1,\text{bot})<=gt(\text{top}-1,\text{mid}) \text{ or } (gte(\text{top}-1,\text{mid}) \text{ and } gt(\text{mid}-1,\text{bot}))$$

and the truth table is:

| INPUT | | | OUTPUT | |
|---|---|---|---|---|
| A | B | C | B AND C | A OR (B AND C) |
| 0 | 0 | 0 | 0 | 0 |
| 0 | 0 | 1 | 0 | 0 |
| 0 | 1 | 0 | 0 | 0 |
| 0 | 1 | 1 | 1 | 1 |
| 1 | 0 | 0 | 0 | 1 |
| 1 | 0 | 1 | 0 | 1 |
| 1 | 1 | 0 | 0 | 1 |
| 1 | 1 | 1 | 1 | 1 |

Alternatively, where available, a three input ANDOR gate which has the truth table above may be used instead of the combination of an AND and an OR gate.

The $GTE_S$ logic element 304 is used to generate intermediate signals gte [top−1, bot] that indicate whether a[top−1, bot]=b[top−1, bot]. Consequently, the signal gte [top−1, bot] relates to two or more bits of each of the inputs a and b (depending upon the values of top and bot). The signal gte [top−1, bot] has two possible values, high (or 1) and low (or 0) and for the purposes of the following description it is assumed that the value of gte [top−1, bot] is high if a[top−1, bot]=b[top−1, bot], although it will be appreciated that the hardware may also be implemented with the value of gte [top−1, bot] being low if a[top−1, bot]=b[top−1, bot].

As shown in FIG. 3, a $GTE_S$ logic element 304 receives two different inputs: gte [top−1, mid] and gte [mid−1, bot] and gte [top−1, mid] and/or gte [mid−1, bot] may be initial signals (as generated using logic elements 202, 204), for example where top−1=mid and/or mid−1=bot. Similarly, either or both of gte [top−1, mid] and gte [mid−1, bot] may be intermediate signals (as generated using logic elements 302, 304 in a previous hardware logic stage), for example where top−1>mid and/or mid−1>bot.

As also shown in FIG. 3, a $GTE_S$ logic element 304 comprises a single AND gate 208 which receives the two inputs gte [top−1, mid] and gte [mid−1, bot]. The operation of the $GTE_S$ logic element 304 may be written in RTL as:

$$gte(\text{top}-1,\text{bot})<=gte(\text{top}-1,\text{mid}) \text{ and } gte(\text{mid}-1,\text{bot})$$

and the truth table is:

| INPUT | | OUTPUT |
|---|---|---|
| A | B | A AND B |
| 0 | 1 | 0 |
| 0 | 0 | 0 |
| 1 | 1 | 1 |
| 1 | 0 | 0 |

There are many different ways in which the $GT_S$ and $GTE_S$ logic blocks 302, 304 can be used to combine the initial 2n or 2n−1 signals in a plurality of hardware logic stages to build up signals that relate to all of the bits of the inputs a and b and in particular to generate select signals s[i] for each bit of the output(s). Various different example max/min logic blocks 400, 401, 500, 501 are shown in FIGS. 4A, 4B, 5A and 5B for n=4 and to reduce the complexity of the diagram, a plurality of $GT_S$ & $GTE_S$ logic blocks 300 are shown instead of separate $GT_S$ and $GTE_S$ logic blocks 302, 304.

Figure 4A:
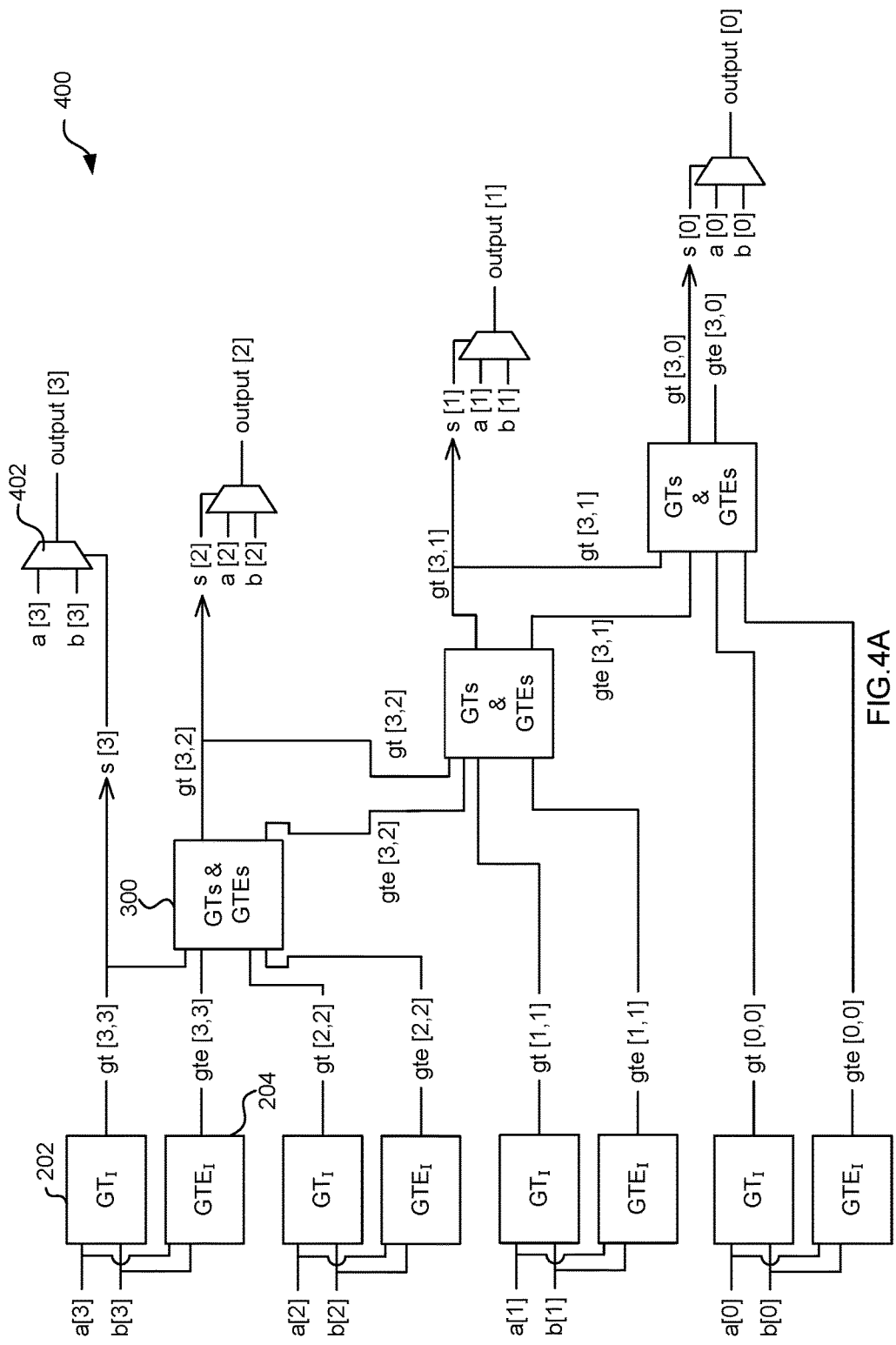
FIG. 4A shows an example max/min logic block comprising a sequential arrangement of the logic blocks shown in FIG. 3.

FIG. 4A shows a first example max/min logic block 400 comprising a sequential arrangement of $GT_S$ & $GTE_S$ logic blocks 300, with the outputs of a first $GT_S$ & $GTE_S$ logic block 300 feeding into inputs of a second $GT_S$ & $GTE_S$ logic block 300 and the outputs of the second $GT_S$ & $GTE_S$ logic block 300 feeding into inputs of a third $GT_S$ & $GTE_S$ logic block 300. This sequential arrangement results in a linear delay in outputting the MSB to the LSB.

In the max/min logic block 400 shown in FIG. 4A, the signals are built up by adding one bit at a time to the initial signals gt[n−1, n−1] and gte[n−1, n−1]. One of these initial signals, gt[n−1, n−1], is the select signal s[n−1] and this is used to drive a multiplexer 402 (or other hardware logic element) to select either a[n−1] or b[n−1] as the MSB of the output, output [n−1].

To reduce the complexity of FIGS. 4A, 4B, 5A and 5B, the max/min logic blocks 400, 401, 500, 501 are only shown generating a single n-bit output (with bits denoted output[i]) where this output may be the maximum of the two inputs (e.g. output[i]=max[i]) or the minimum of the two inputs (e.g. output[i]=min[i]). It will be appreciated that the max/min logic block may alternatively output both the maximum and minimum values in which case, there may be two multiplexers 402 per output bit (each controlled by the select signal s[i]) or an alternative logic arrangement may be used to output a single bit for each output (i.e. to output both min[i] and max[i] based on the select signal s[i]).

The first $GT_S$ & $GTE_S$ logic block 300 combines these signals with the gt[n−2, n−2] and gte[n−2, n−2] signals (in this example, n=4) to generate intermediate signals gt[n−1, n−2] and gte[n−1, n−2] and one of these generated signals, gt[n−1, n−2], is the select signal s[n−2]. This select signal is used to drive a multiplexer 402 (or other hardware logic element) to select either a[n−2] or b[n−2] as the next most significant bit of the output, output[n−2].

The second $GT_S$ & $GTE_S$ logic block 300 combines these intermediate signals with the gt[n−3, n−3] and gte[n−3, n−3] signals to generate further intermediate signals gt[n−1, n−3] and gte[n−1, n−3] and again one of these generated signals, gt[n−1, n−3], is the select signal s[n−3]. This select signal is used to drive a multiplexer 402 (or other hardware logic element) to select either a[n−3] or b[n−3] as the corresponding bit of the output, output [n−3].

The third (and final) $GT_S$ & $GTE_S$ logic block 300 combines the gt[n−1, n−3] and gte[n−1, n−3] signals with the gt[n−4, n−4] and gte[n−4, n−4] signals to generate at least one further intermediate signal gt[n−1, n−4] which is the select signal s[n−4] and may also generate gte[n−1, n−4]. Select signal s[n−4] is used to drive a multiplexer 402 (or other hardware logic element) to select either a[n−4] or b[n−4] as the LSB of the output, output [n−4].

Figure 4B:
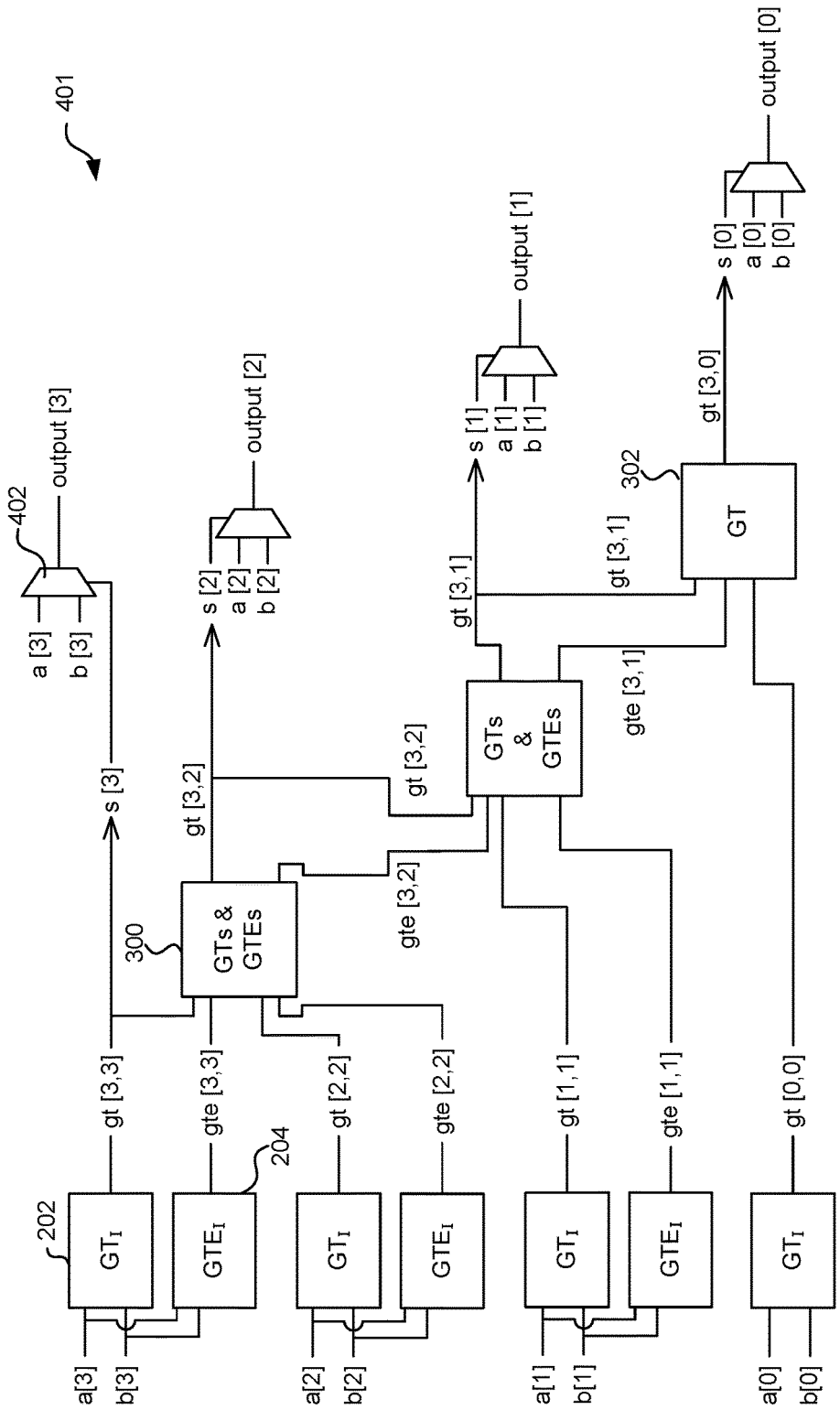
FIG. 4B shows a variation of the max/min logic block shown in FIG. 4A.

As noted above, the gte[n−1, n−4] signal need not be generated as it is not used in the generation of any further gt[n−1, i] signals and FIG. 4B shows a variation in which the gte[n−1, n−4] signal is not generated and nor is the gte[n−4, n−4] signal which is only used (in FIG. 4A) to generate the gte[n−1, n−4] signal. However, if the GTE implementation is the exact inequality (XNOR gate) then the gte[n−1, n−4] signal may provide a useful output flag which indicates whether the two inputs a and b are equal (i.e. the gte[n−1, n−4] signal can only be 1 if all XNOR outputs were 1, which implies all corresponding bits were equal, so a=b).

Figure 5A:
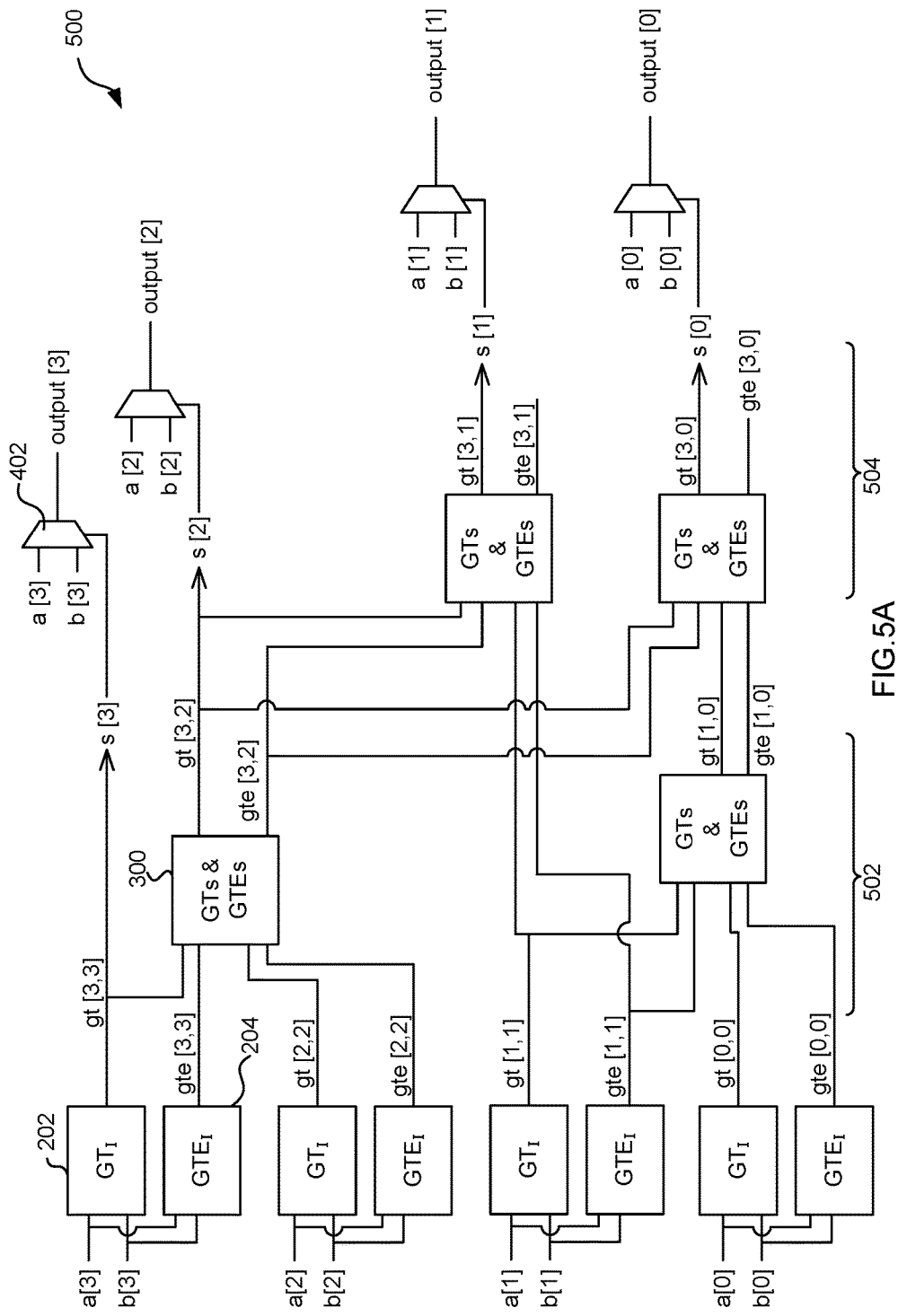
FIG. 5A shows an example max/min logic block comprising a logarithmic arrangement of the logic blocks shown in FIG. 3.

FIG. 5A shows a second example max/min logic block 500 comprising a logarithmic arrangement that uses a plurality of hardware stages 504, 504 (each comprising one or more $GT_S$ & $GTE_S$ logic blocks 300) to combine the initial signals and generate signals that relate to more than one of the bits from each of the inputs a and b. This arrangement results in a logarithmic delay (which is related to the number of input bits, n) in outputting the MSB to the LSB.

In the max/min logic block 500 shown in FIG. 5A, intermediate signals are built up first from the 2n initial signals gt[i, i] and gte[i, i] for pairs of adjacent bits (bits [3,2] and [1,0]) in a first hardware stage 502. Initial and intermediate signals are then combined to generate signals for tuples of adjacent bits (bits [3,1]) and quads of adjacent bits (bits [3,0]) in a second hardware stage 504. In the example shown no further hardware stages are required because n=4; however, for larger values of n, a third hardware stage would generate signals for groups of 8, 7, 6 and 5 adjacent bits, a fourth hardware stage would generate signals for groups of 16, 15, . . . , 9 adjacent bits and an $m^{th}$ hardware stage would generate signals for groups of $2^m$, $2^m-1$, $2^m-2$, . . . , $2^{m-1}+1$ groups of adjacent bits.

The number of hardware stages, h, that are required in such a max/min logic block 500 is given by $2^h \geq n > 2^{h-1}$. The number of $GT_S$ & $GTE_S$ logic blocks 300 in an $m^{th}$ hardware stage is given by:

$$\left\lfloor \frac{n}{2^m} \right\rfloor * 2^{m-1} + (n \bmod 2^m > 2^{m-1}) ? (n \bmod 2^m) - 2^{m-1} : 0$$

as written in standard ternary conditional notation:
[condition] ? [output if true] : [output if false]

Figure 5B:
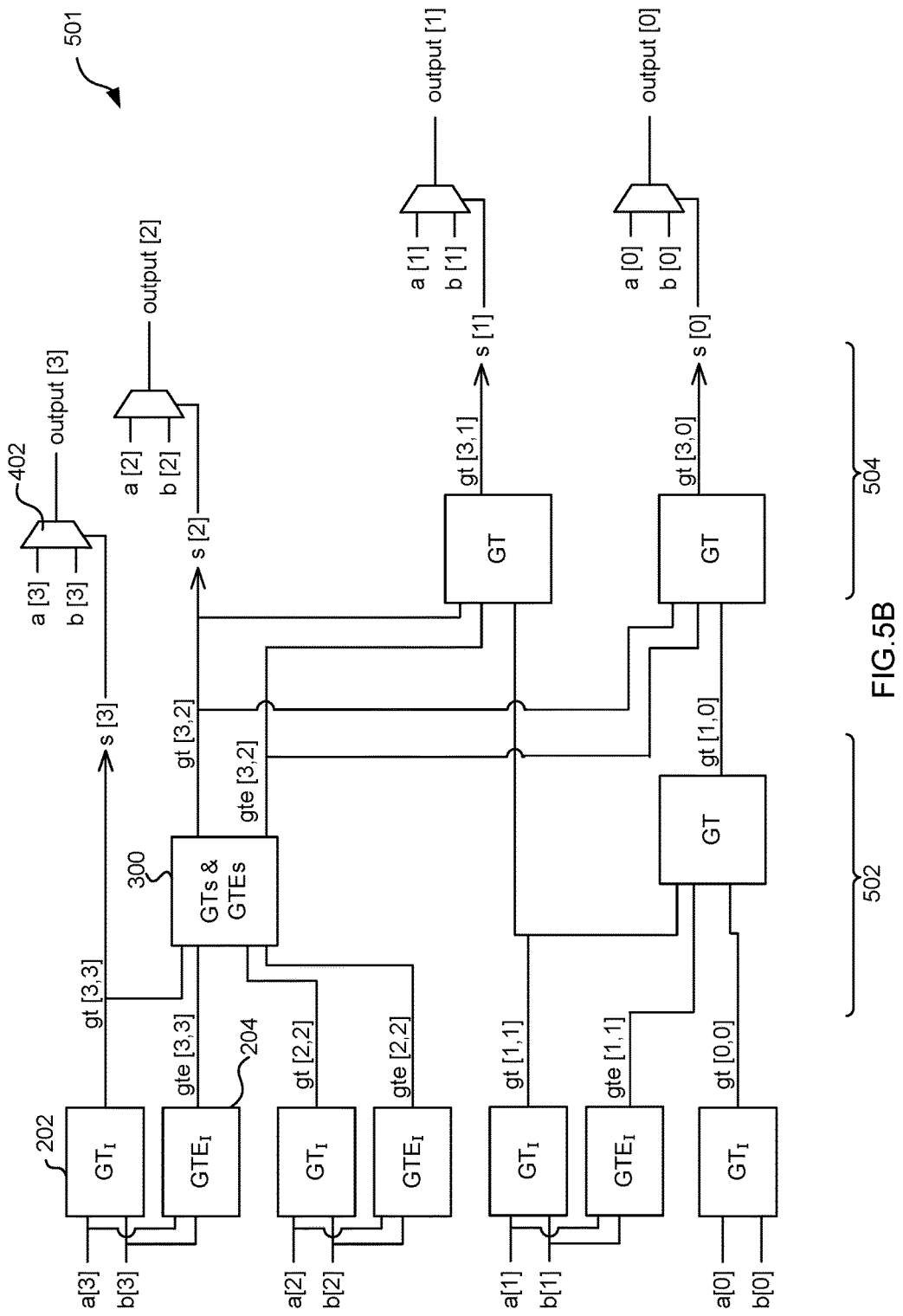
FIG. 5B shows a variation of the max/min logic block shown in FIG. 5A.

FIG. 5B shows a variation of the max/min logic block shown in FIG. 5A. In a similar manner to FIG. 4B, the max/min logic block 501 shown in FIG. 5B does not generate the gte signals that are not subsequently used in generating an output signal and hence only 2n−1 initial signals are generated. This reduces the number of GTE logic blocks 304 that are required in each of the hardware stages.

Figure 6:
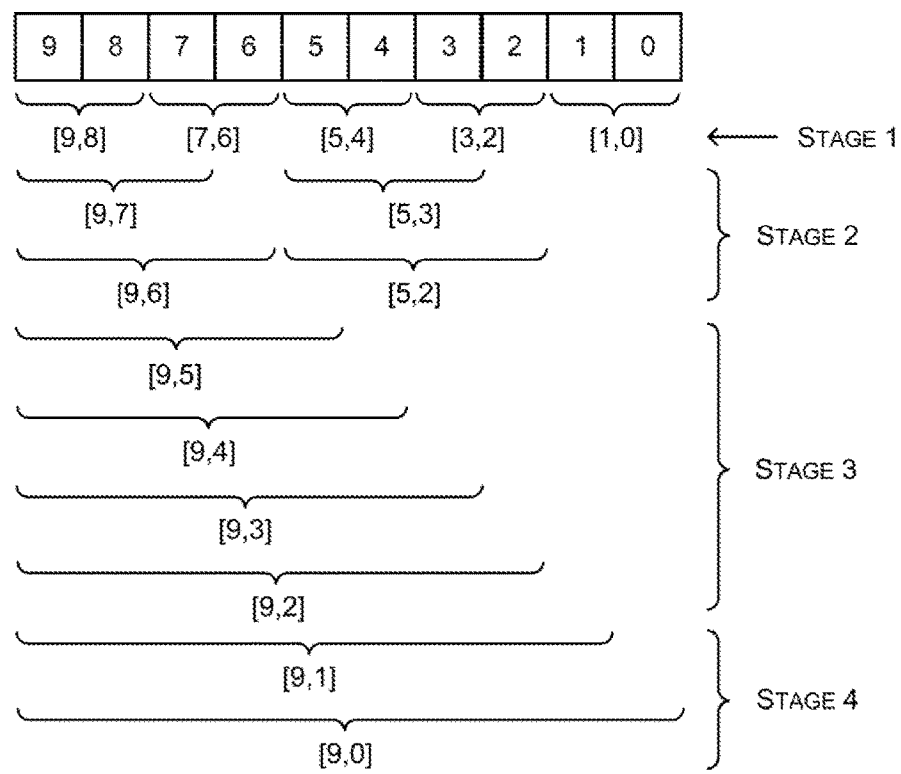
FIG. 6 is a graphical representation of another logarithmic arrangement of the logic blocks shown in FIG. 3.

A further example of the logarithmic arrangement is shown graphically in FIG. 6 for n=10. The initial signals gt[i, i] and gte[i, i] are first generated and then in stage 1, intermediate signals are generated (in a plurality of $GT_S$ & $GTE_S$ logic blocks 300) for pairs of adjacent bits: [9,8], [7,6], [5,4], [3,2] and [1,0]. In stage 2, signals for quads and tuples of adjacent bits are generated where the tuples are for bits [9,7] and [5,3] and the quads are for bits [9,6], [5,2]. It can be seen from this that although the quads are contiguous, the tuples are not (e.g. bit 6 is not included in a tuple) and it can be seen that the tuples are formed within the quads and starting at the same MSB as the quads (e.g. bits 9 and 5 in this example).

In stage 3, signals for groups of 8, 7, 6 and 5 bits are formed and again, although the groups of 8 bits ($2^m$ bits, for m=3) are contiguous, the groups of 7, 6 and 5 bits are not and are formed within the group of 8 bits, starting at the same MSB (bit 9 in this example. The final stage is stage 4 (because $2^4 \geq n > 2^3$) and in this stage, signals for groups of 16, 15, 14, 13, 12 and 11 bits cannot be formed because there are only 10 bits (n=10), but signals for groups of 10 and 9 bits ([9,0] and [9,1]) are formed.

Although FIGS. 4A and 5A are shown as built from a plurality of $GT_S$ & $GTE_S$ logic blocks 300 to reduce the complexity of the diagrams, each of these logic blocks 300 comprises a $GT_S$ logic block 302 and a $GTE_S$ logic block 304. In some cases, the output of the $GTE_S$ logic block 204, 304 is not used (e.g. gte[3,0] in FIG. 4A and gte[3,0] and gte[3,1] in FIG. 5A) and so the $GTE_S$ logic blocks 204, 304 which generate these signals may be omitted from the hardware arrangement, as shown in the corresponding examples in FIGS. 4B and 5B.

By comparing the max/min logic units 400, 500 shown in FIGS. 4A and 5A, it can be seen that the sequential approach (shown in FIG. 4A) involves more hardware stages (as the outputs of the first $GT_S$ & $GTE_S$ logic block 300 feed into the second $GT_S$ & $GTE_S$ logic block 300 and the outputs of this second $GT_S$ & $GTE_S$ logic block 300 then feed into the third $GT_S$ & $GTE_S$ logic block 300) than the logarithmic arrangement (shown in FIG. 5A) but requires less hardware (there are only three $GT_S$ & $GTE_S$ logic blocks 300 in FIG. 4A compared to four $GT_S$ & $GTE_S$ logic blocks 300 in FIG. 5A). The logarithmic arrangement (of FIG. 5A) therefore is larger (e.g. in terms of silicon area) than the sequential arrangement (of FIG. 4A) but may take less time to output all of the bits of the output(s).

Other example max/min logic units may use a combination of the sequential and logarithmic approaches described above, for example, to trade-off between area and speed. In an example, the sequential approach may be used for the MSBs (e.g. bits [9,5] for n=10) and the logarithmic approach may be used for the LSBs (e.g. bits [4,0] for n=10).

In the max/min logic units 400, 401, 500, 501 shown in FIGS. 4A, 4B, 5A and 5B, a select signal s[i] is generated for each of the bits in the output(s), i.e. n select signals are generated (one is an initial signal and the remaining n−1 are intermediate signals). In an optimization, however, the MSB of the output(s) (max[n−1] and/or min[n−1]) may be treated separately and generated using a single logic gate as shown in the RTL below without generating a select signal s[n−1]:

$$\max(n-1) <= a(n-1) \text{ or } b(n-1)$$

$$\min(n-1) <= a(n-1) \text{ and } b(n-1)$$

This results in a simplification of the max/min logic unit 700, 800 (as shown in FIGS. 7 and 8) because instead of having a multiplexer 402 (or other hardware logic element) controlled by a select signal s[n−1], this is replaced by a single logic gate 702 for each output, where this logic gate is an OR gate if the output is the maximum of a and b and where this logic gate is an AND gate if the output is the minimum of a and b.

As shown in FIGS. 7 and 8, although the select signal s[n−1] is not generated, the intermediate signal gt[n−1, n−1], which is used as the select signal s[n−1] in FIGS. 4A, 4B, 5A and 5B is still generated because it is needed in the generation of the other select signals; however, it is never used as a select signal (i.e. it is not used to drive a multiplexer 402).

In various examples, the LSB of the output(s) may in addition, or instead, be treated separately and generated using simplified logic (e.g. compared to that shown in FIGS. 4, 5, 7 and 8).

As with FIGS. 4A, 4B, 5A and 5B, to reduce the complexity of FIGS. 7 and 8, the max/min logic blocks 700, 800 are only shown generating a single n-bit output (with bits denoted output[i]) where this output may be the maximum of the two inputs (e.g. output[i]=max[i]) or the minimum of the two inputs (e.g. output[i]=min[i]). It will be appreciated that the max/min logic block may alternatively output both the maximum and minimum values in which case, there may be both an AND gate and an OR gate to generate max[n−1] and min[n−1] and then either two multiplexers 402 per remaining output bit (each controlled by a select signal s[i]) or an alternative logic arrangement may be used to output a single bit for each output other than the MSBs (i.e. to output both min[i] and max[i] based on the select signal s[i]).

In a similar manner to FIGS. 4A and 5A, although FIGS. 7 and 8 are shown as built from a plurality of $GT_S$ & $GTE_S$ logic blocks 300 to reduce the complexity of the diagrams, each of these logic blocks 300 comprises a $GT_S$ logic block 302 and a $GTE_S$ logic block 304. In some cases, the output of the GTE logic block 204, 304 is not used and so the GTE logic blocks 204, 304 which generate these signals may be omitted from the hardware arrangement.

Figure 9:
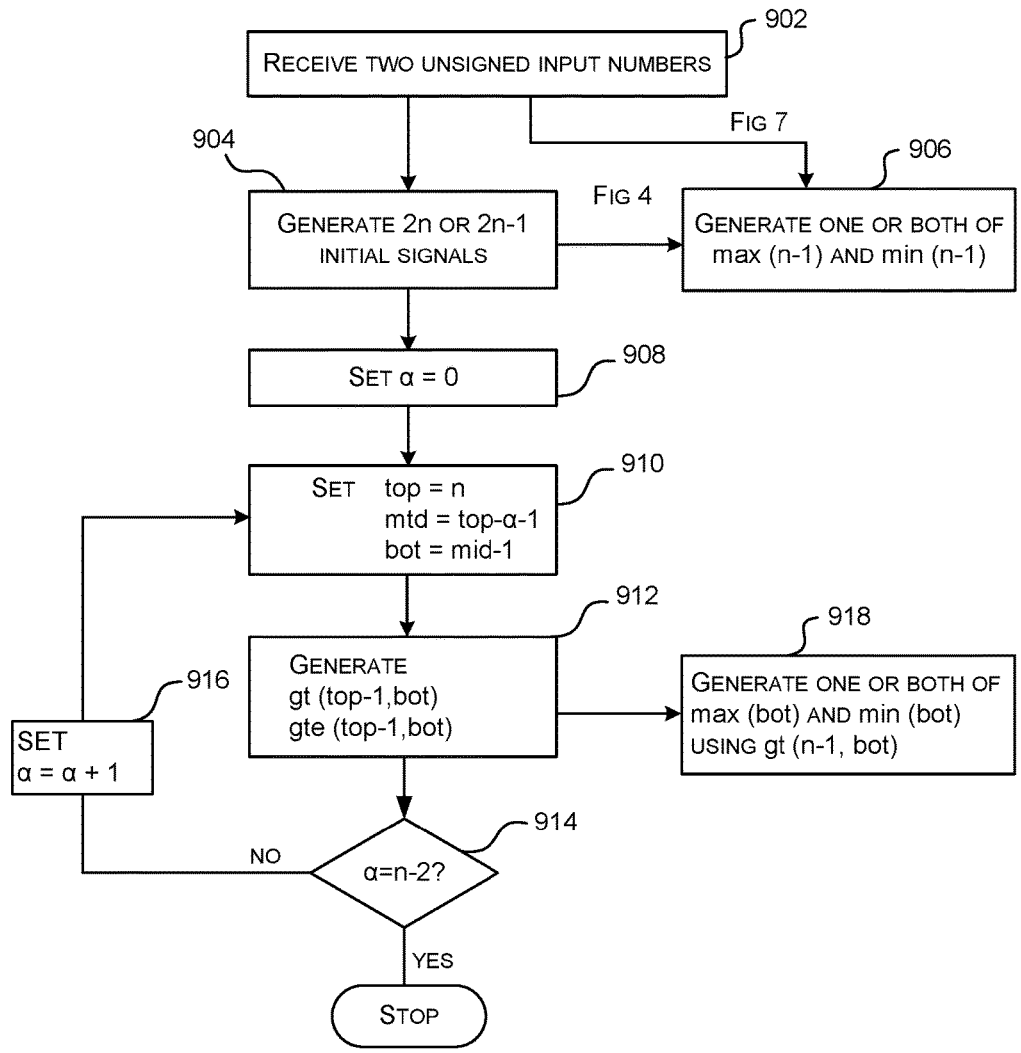
FIG. 9 is a flow diagram which shows an example method of generating the maximum and/or minimum of two n-bit unsigned input numbers and which corresponds to the hardware shown in FIGS. 4 and 7.

FIG. 9 is a flow diagram which shows an example method of generating the maximum and/or minimum of two n-bit unsigned input numbers and this corresponds to the hardware shown in FIGS. 4A, 4B and 7 and described above. As described above, two n-bit unsigned input numbers are received (block 902) and from these 2n or 2n−1 initial signals are generated (block 904). FIGS. 4A and 7 show examples in which 2n initial signals are generated (in block 904) and FIG. 4B shows an example in which 2n−1 initial signals are generated. As described above, the MSB of the output(s) is generated (block 906) from either one of the initial signals (as generated in block 904, as shown in FIGS. 4A and 4B) or directly from the MSBs of the two input numbers (as shown in FIG. 7). Having generated the initial signals (in block 904), the intermediate signals are generated sequentially (blocks 908-916) by generating intermediate signals that, in each iteration, relate to one more bit than the previous iteration. In each iteration, one further bit for each of the one or two outputs is generated (block 918).

Although FIG. 9 shows the generation of both a gt and a gte signal (in block 912) in each iteration, it will be appreciated that in some iterations the generation of the gte signal may be omitted because the gte signal is not used in generating a select signal (i.e. the signal is not connected to an output of the max/min logic block).

Figure 10:
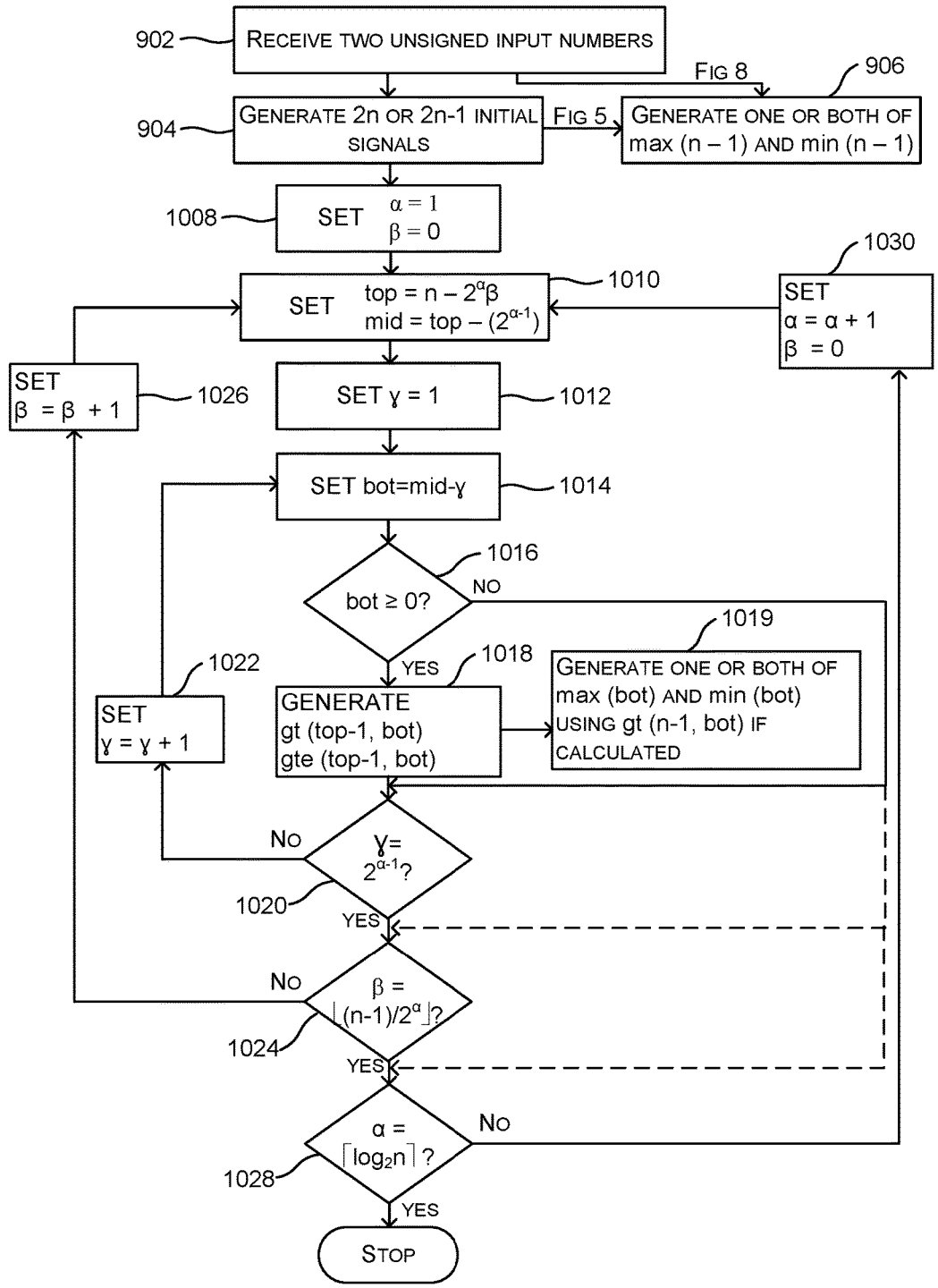
FIG. 10 is a flow diagram which shows another example method of generating the maximum and/or minimum of two n-bit unsigned input numbers and which corresponds to the hardware shown in FIGS. 5 and 8.

FIG. 10 is a flow diagram which shows an example method of generating the maximum and/or minimum of two n-bit unsigned input numbers and this corresponds to the hardware shown in FIGS. 5A, 5B and 8 and described above. As described above, two n-bit unsigned input numbers are received (block 902) and from these 2n or 2n−1 initial signals are generated (block 904). As described above, the MSB of the output(s) is generated (block 906) from either one of the initial signals (as generated in block 904, as shown in FIGS. 5A and 5B) or directly from the MSBs of the two input numbers (as shown in FIG. 8). Having generated the initial signals (in block 904), the intermediate signals are generated logarithmically (blocks 1008-1030) by generating intermediate signals for pairs of adjacent bits.

Initially $\alpha=1$ and $\beta=0$ (as set in block 1008), which gives initial values of top=n, mid=n−1 (as set in block 1010) and bot=n−2 (as set in block 1014 using the initial value of $\gamma=1$ from block 1012). The first iteration therefore generates gt(n−1, n−2) and gte(n−1, n−2) (in block 1018) and as a result one or both of max(n−2) and min(n−2) are generated (in block 1019). As $\gamma=2^{\alpha-1}=1$ ('Yes' in block 1020), the value of $\gamma$ is not incremented, but as $\beta \not\geq \lfloor (n-1)/2^\alpha \rfloor$ ('No' in block 1024, e.g. for n=4, $\beta \not\geq \lfloor (4-1)/2 \rfloor = \lfloor 1.5 \rfloor = 1$), the value of $\beta$ is incremented (in block 1026).

In the second iteration, $\alpha=1$ (as set in block 1008) and $\beta=1$ (as set in block 1026), which gives initial values of top=n−2, mid=n−3 (as set in block 1010) and bot=n−4 (as set in block 1014 using the initial value of $\gamma=1$ from block 1012). The second iteration therefore generates gt(n−3, n−4) and gte(n−

3, n–4) (in block 1018) and as a result no max(bot) or min(bot) are generated (in block 1019, i.e. because block 1018 does not generate a gt(n–1, bot) signal). As $\gamma=2^{\alpha-1}=1$ ('Yes' in block 1020), the value of $\gamma$ is not incremented and as $\beta=\lfloor(n-1)/2^{\alpha}\rfloor$ ('Yes' in block 1024, e.g. for n=4, $\beta=\lfloor(4-1)/2\rfloor=\lfloor1.5\rfloor=1$), the value of $\beta$ is not incremented either.

As $\alpha\neq\lceil\log_2 n\rceil$ for n=4 ('No' in block 1028), the value of $\alpha$ is incremented (block 1030). In the third iteration, $\alpha=2$ and $\beta=0$ (as set in block 1030), which gives initial values of top=n, mid=n–2 (as set in block 1010) and bot=n–3 (as set in block 1014 using the initial value of $\gamma=1$ from block 1012). The third iteration therefore generates gt(n–1, n–3) and gte(n–1, n–3) (in block 1018) and as a result one or both of max(n–3) and min(n–3) are generated (in block 1019). As $\gamma\neq2^{\alpha-1}$ ('No' in block 1020), the value of $\gamma$ is incremented (in block 1022).

In the fourth iteration, $\alpha=2$, $\beta=0$, $\gamma=2$ and the values of top and mid are unchanged (this iteration starts at block 1014), i.e. top=n, mid=n–2 (as set in block 1010 of the previous iteration) and bot=n–4 (as set in block 1014 using the incremented value of $\gamma=2$ from block 1022). The fourth iteration therefore generates gt(n–1, n–4) and gte(n–1, n–4) (in block 1018) and as a result one or both of max(n–4) and min(n–4) are generated (in block 1019). As $\gamma=2^{\alpha-1}$ ('Yes' in block 1020), the value of $\gamma$ is not incremented, but as $\beta=\lfloor n-1)/2^{\alpha}\rfloor$ ('Yes' in block 1024, e.g. for n=4, $=\lfloor(4-1)/4\rfloor=\lfloor0.75\rfloor=0$), the value of $\beta$ is not incremented (in block 1026). Furthermore, as $\alpha=\lceil\log_2 n\rceil$ ('Yes' in block 1028), the value of $\alpha$ is not incremented and the method ends.

So using the method of FIG. 10 for n=4, the select signal(s) for the MSB, i=3 (i.e. s[3]) and the next bit, i=2 (i.e. s[2]) are generated in the first iteration (in blocks 906 and 918 respectively), the select signal(s) for the next bit, i=1 (i.e. s[1]) is generated in the third iteration (in block 1019) and the select signal(s) for the LSB, i=0 (i.e. s[0]) is generated in the fourth iteration (in block 1019).

In the example described above with reference to FIG. 10, the value of bot is always greater than or equal to zero and so the 'Yes' path from block 1016 is taken in every iteration in the example. In some examples, however, this may not the case (e.g. where n is not a power of two) and in the event that bot is negative ('No' in block 1016), the method skips to one of blocks 1020, 1024 or 1028, all of which give the same result (although in some examples skipping to block 1020 may result in additional loops of incrementing $\gamma$, but these all result in a 'No' in block 1016 and so no additional intermediate signals are generated).

Although FIG. 10 shows the generation of both a gt and a gte signal (in block 1018), it will be appreciated that in some iterations the generation of the gte signal may be omitted because the gte signal is not used in generating a select signal (i.e. the signal is not connected to an output of the max/min logic block).

The above description assumes that the two inputs a and b are unsigned numbers (which may be integers or include a radix point); however the max/min logic units described herein may also be used for signed inputs a' and b' (i.e. signed inputs which are represented using two's-complement notation). In two's complement notation the first bit (i.e. the MSB) indicates whether the number is positive (MSB is zero) or negative (MSB is one), i.e. the MSB has the value $-2^{n-1}$ rather than $2^{n-1}$.

If two inputs $a^s$ and $b^s$ are n-bit signed numbers in two's complement notation, prior to inputting these into a max/min logic unit as described herein, the value $2^{n-1}$ is added to each input to generate two n-bit unsigned values a and b which are then input to the max/min logic unit, i.e.:

$$a=a^s+2^{n-1}$$

$$b=b^s+2^{n-1}$$

Having generated the output(s) (max and/or min) using the max/min logic unit, the value $2^{n-1}$ is subtracted the output(s) to give the correct output(s) ($max^s$ and/or $min^s$) for the signed inputs $a^s$ and $b^s$, i.e.:

$$max^s=max-2^{n-1}$$

$$min^s=min-2^{n-1}$$

These additions and subtractions simply involve logically negating the MSB and so only require four NOT gates in total to implement. Furthermore, the min and max values are correct because translating both values by an equal amount on the number-line does not change which one is the minimum and which is the maximum.

In the methods and hardware described above, a plurality of separate select signals s[i] are generated, each of which control the selection of a single bit (a[i] or b[i]) from one of the two binary inputs (a and b) and collectively, all the n bits of the output value are determined. In other examples, however, each of the plurality of select signals control the selection of multiple adjacent bits (e.g. each select signal may control the selection of a different, non-overlapping proper subset of adjacent bits of the n bits of an output value). The term 'non-overlapping' is used herein to refer to the fact that a particular bit of the output value is selected based on a single select signal (i.e. there are not two or more select signals that relate to the same bit of the output value). Collectively the plurality of select signals control the selection of all the n bits of the output value and so each bit in the output value corresponds to one (and only one) select signal. In an example, the two inputs may be split into pairs of adjacent bits and the gt[n–1, n–2i] signals are generated (which requires less logic than creating all the gt[n–1, n–i] signals in the arrangement of FIG. 10). The gt[n–1, n–2i] signals form the select signals and each select signal is used to drive two multiplexers (or otherwise select two bits) and so the reduction in the logic to generate the intermediate signals results in an increase in fanout. In this example, each non-overlapping proper subset comprises a pair of adjacent bits.

In the methods and hardware described above, the initial signals are all generated from a single corresponding bit from each of the inputs (e.g. from a[i] and b[i]). In other examples, however, more than one adjacent bit from each of the inputs may be used to generate the initial gt and gte signals. This would involve more complex logic than the single AND and OR/XOR gates (as shown in FIG. 2). For example, native '>' and '=' operators could be used instead to make the initial gt and gte signals for groups of adjacent bits greater than 1 in size.

The max/min logic units described above may be used as part of a larger sorter arrangement (e.g. similar to that shown in FIG. 1) to sort more than two numbers into numerical order or to identify the maximum or minimum values from a set of more than two input numbers. There are many applications for such max/min logic units and one example is a median filter which is used to discard outlying values (e.g. for noise reduction). Median filters may, for example, be used in determining a colour value for a pixel based on three different projections of an image. There are many other applications for median filters in digital image processing. Another example application is for sorting floating point inputs to a multiple input floating point accumulator, where adding up the smallest values (with the same sign) is the best ordering for accuracy. The output depends on accuracy due to intermediate rounding in the floating point accumulator. Other applications for the max/min logic units described above include excluding outliers (e.g. without necessarily sorting, in any way, the values between the largest and smallest), approximating the length of a vector (e.g. using the technique described in "A Fast Approximation To The Hypotenuse" by Alan Paeth in the book Graphics Gems) and performing level of detail (LOD) calculations in anisotropic filtering (e.g. because the LOD depends on the narrowest dimension of the elliptical pixel footprint, as described at https://www.opengl.org/registry/specs/EXT/texture_filter_anisotropic.txt).

The max/min logic units of FIGS. 4, 5, 7 and 8 are shown as comprising a number of functional blocks. This is schematic only and is not intended to define a strict division between different logic elements of such entities. Each functional block may be provided in any suitable manner.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed in an integrated circuit manufacturing system configures the system to manufacture a max/min logic unit as described herein, or to manufacture a sorter, processor, or any other hardware object comprising a max/min logic unit as described herein rein. An integrated circuit definition dataset may be, for example, an integrated circuit description.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a max/min logic unit as described herein will now be described with respect to FIG. 11.

Figure 11:
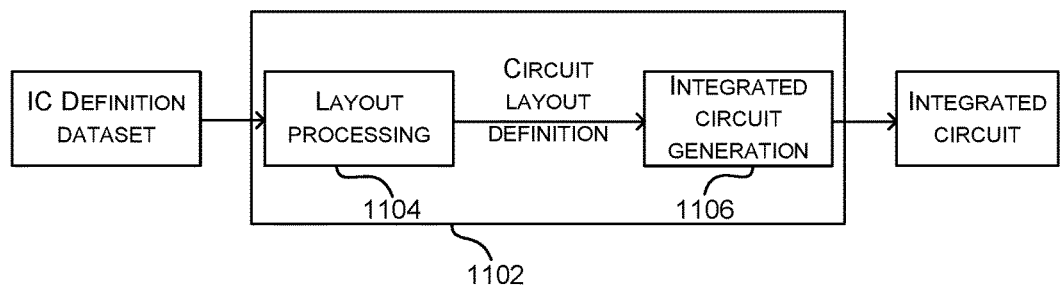
FIG. 11 shows an integrated circuit manufacturing system for generating an integrated circuit embodying a max/min logic unit.

FIG. 11 shows an example of an integrated circuit (IC) manufacturing system 1102 which comprises a layout processing system 1104 and an integrated circuit generation system 1106. The IC manufacturing system 1102 is configured to receive an IC definition dataset (e.g. defining a max/min logic unit as described in any of the examples herein), process the IC definition dataset, and generate an IC according to the IC definition dataset (e.g. which embodies a max/min logic unit as described in any of the examples herein). The processing of the IC definition dataset configures the IC manufacturing system 1102 to manufacture an integrated circuit embodying a max/min logic unit as described in any of the examples herein.

The layout processing system 1104 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1104 has determined the circuit layout it may output a circuit layout definition to the IC generation system 1106. A circuit layout definition may be, for example, a circuit layout description.

The IC generation system 1106 generates an IC according to the circuit layout definition, as is known in the art. For example, the IC generation system 1106 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1106 may be in the form of computer-readable code which the IC generation system 1106 can use to form a suitable mask for use in generating an IC.

The different processes performed by the IC manufacturing system 1102 may be implemented all in one location, e.g. by one party. Alternatively, the IC manufacturing system 1002 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a max/min logic unit without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 11 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 11, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

The invention claimed is:

1. A hardware arrangement arranged to receive first and second n-bit input values and output an n-bit maximum value and/or an n-bit minimum value selected from the two input values, the hardware arrangement comprising:
   n first logic blocks, wherein an $i^{th}$ first logic block is arranged to receive an $i^{th}$ bit from each of the input values and output an initial signal indicating whether the $i^{th}$ bit from the first input value is greater than the $i^{th}$ bit from the second input value;
   n or n−1 second logic blocks, wherein an $i^{th}$ second logic block is arranged to receive an $i^{th}$ bit from each of the input values and output an initial signal indicating whether the $i^{th}$ bit from the first input value is equal to the $i^{th}$ bit from the second input value;
   a plurality of third logic blocks arranged to receive a plurality of signals from one or more of a first logic block, second logic block, and another third logic block, the signals comprising a signal indicating whether a group of one or more bits from the first input value are greater than a corresponding group of bits from the second input value, a signal indicating whether the group of bits from the first input value are equal to the corresponding group of bits from the second input value and a signal indicating whether an adjacent group of one or more bits from the first input value are greater than the corresponding adjacent group of bits from the second input value and to combine the received signals using logic gates to output an intermediate signal indicating whether a larger group of bits from the first input value are greater than a corresponding larger group of bits from the second input value, the larger group of bits comprising the group of one or more bits and the adjacent group of one or more bits;
   a plurality of fourth logic blocks arranged to receive a signal indicating whether a group of one or more bits from the first input value are equal to a corresponding group of bits from the second input value and a signal indicating whether an adjacent group of one or more bits from the first input value are equal to a corresponding adjacent group of bits from the second input value and to combine the received signal using a logic gate to output an intermediate signal indicating whether a larger group of bits from the first input value are equal to a corresponding larger group of bits from the second input value, the larger group of bits comprising the group of one or more bits and the adjacent group of one or more bits; and
   wherein the plurality of third logic blocks are arranged in two or more hardware stages, wherein a first hardware stage generates intermediate signals for pairs of adjacent bits and a second hardware stage generates intermediate signals for tuples and quads of adjacent bits; and
   wherein the hardware arrangement further comprises n−1 fifth logic blocks, wherein a fifth logic block is arranged to receive a signal output from a third logic block and based on the received signal to output a bit from either the first input value or the second input value such that an $i^{th}$ bit of the output value is selected based on a comparison of bits [n−1, i] from each of the input values, wherein n−1≥i≥0.

2. The hardware arrangement according to claim 1, wherein an $i^{th}$ first logic block comprises:
   a first input arranged to receive the $i^{th}$ bit from the first input value;
   a second input arranged to receive the $i^{th}$ bit from the second input value;
   a NOT gate having an input connected to the second input; and
   an AND gate having an input connected to the first input, an input connected to an output of the NOT gate and an output arranged to output the initial signal indicating whether the $i^{th}$ bit from the first input value is greater than the $i^{th}$ bit from the second input value.

3. The hardware arrangement according to claim 1, wherein an $i^{th}$ second logic block comprises:
   a first input arranged to receive the $i^{th}$ bit from the first input value;
   a second input arranged to receive the $i^{th}$ bit from the second input value;
   a NOT gate having an input connected to the second input; and
   an XOR gate having an input connected to the first input, an input connected to an output of the NOT gate and an output arranged to output the initial signal indicating whether the $i^{th}$ bit from the first input value is equal to the $i^{th}$ bit from the second input value.

4. The hardware arrangement according to claim 1, wherein an $i^{th}$ second logic block comprises:
   a first input arranged to receive the $i^{th}$ bit from the first input value;
   a second input arranged to receive the $i^{th}$ bit from the second input value;
   a NOT gate having an input connected to the second input; and
   an OR gate having an input connected to the first input, an input connected to an output of the NOT gate and an output arranged to output the initial signal indicating whether the $i^{th}$ bit from the first input value is equal to the $i^{th}$ bit from the second input value.

5. The hardware arrangement according to claim 1, wherein a third logic block comprises:
   a first input arranged to receive a signal indicating whether a group of bits from the first input value are greater than a corresponding group of bits from the second input value;
   a second input arranged to receive a signal indicating whether the group of bits from the first input value are equal to the corresponding group of bits from the second input value;
   a third input arranged to receive a signal indicating whether an adjacent group of bits from the first input value are greater than the corresponding adjacent group of bits from the second input value;
   an AND gate having an input connected to the second input and an input connected to the third input; and
   an OR gate having an input connected to the first input, an input connected to an output of the AND gate and an output arranged to output an intermediate signal indicating whether a larger group of bits from the first input value are greater than a corresponding larger group of bits from the second input value, the larger group of bits comprising the group of bits and the adjacent group of bits.

6. The hardware arrangement according to claim 1, wherein a fourth logic block comprises:

a first input arranged to receive a signal indicating whether a group of bits from the first input value are equal to a corresponding group of bits from the second input value;

a second input arranged to receive a signal indicating whether an adjacent group of bits from the first input value are equal to a corresponding adjacent group of bits from the second input value; and an AND gate having an input connected to the first input, an input connected to the second input and an output arranged to output an intermediate signal indicating whether a larger group of bits from the first input value are equal to a corresponding larger group of bits from the second input value, the larger group of bits comprising the group of bits and the adjacent group of bits.

7. A hardware arrangement according to claim 1, wherein an $m^{th}$ hardware signal generates intermediate signals for groups of $2^m, 2^m-1, 2^m-2, \ldots, 2^{m-1}+1$ adjacent bits.

8. The hardware arrangement according to claim 1, wherein the plurality of third logic blocks are arranged in h hardware stages, wherein $2^h \geq n > 2^{h-1}$, $1 \leq m \leq h$ and an $m^{th}$ hardware stage comprises T third logic blocks, where $$T \leq \left\lfloor \frac{n}{2^m} \right\rfloor * 2^{m-1} + (n \bmod 2^m > 2^{m-1})?(n \bmod 2^m) - 2^{m-1}:0,$$

and wherein for $m \geq 2$, a third logic block in an $m^{th}$ hardware stage is arranged to receive at least two signals from a third logic block in an $m-1^{th}$ hardware stage, the at least two signals comprising a signal indicating whether a group of m bits from the first input value are greater than a corresponding group of m bits from the second input value and a signal indicating whether a group of m bits from the first input value are equal to the corresponding group of m bits from the second input value.

9. A computer readable storage medium having stored thereon an integrated circuit definition dataset that, when processed in an integrated circuit manufacturing system, configures the system to manufacture a hardware arrangement arranged to receive first and second n-bit input values and output an n-bit maximum value and/or an n-bit minimum value selected from the two input values, the hardware arrangement comprising:

n first logic blocks, wherein an $i^{th}$ first logic block is arranged to receive an $i^{th}$ bit from each of the input values and output an initial signal indicating whether the $i^{th}$ bit from the first input value is greater than the $i^{th}$ bit from the second input value;

n or n−1 second logic blocks, wherein an $i^{th}$ second logic block is arranged to receive an $i^{th}$ bit from each of the input values and output an initial signal indicating whether the $i^{th}$ bit from the first input value is equal to the $i^{th}$ bit from the second input value;

a plurality of third logic blocks arranged to receive a plurality of signals from one or more of a first logic block, second logic block, and another third logic block, the signals comprising a signal indicating whether a group of one or more bits from the first input value are greater than a corresponding group of bits from the second input value, a signal indicating whether the group of bits from the first input value are equal to the corresponding group of bits from the second input value and a signal indicating whether an adjacent group of one or more bits from the first input value are greater than the corresponding adjacent group of bits from the second input value and to combine the received signals using logic gates to output an intermediate signal indicating whether a larger group of bits from the first input value are greater than a corresponding larger group of bits from the second input value, the larger group of bits comprising the group of one or more bits and the adjacent group of one or more bits;

a plurality of fourth logic blocks arranged to receive a signal indicating whether a group of one or more bits from the first input value are equal to a corresponding group of bits from the second input value and a signal indicating whether an adjacent group of one or more bits from the first input value are equal to a corresponding adjacent group of bits from the second input value and to combine the received signal using a logic pate to output an intermediate signal indicating whether a larger group of bits from the first input value are equal to a corresponding larger group of bits from the second input value, the larger group of bits comprising the group of one or more bits and the adjacent group of one or more bits; and wherein the plurality of third logic blocks are arranged in two or more hardware stages, wherein a first hardware stage generates intermediate signals for pairs of adjacent bits and a second hardware stage generates intermediate signals for tuples and quads of adjacent bits;

and wherein the hardware arrangement further comprises n−1 fifth logic blocks, wherein a fifth logic block is arranged to receive a signal output from a third logic block and based on the received signal to output a bit from either the first input value or the second input value such that an $i^{th}$ bit of the output value is selected based on a comparison of bits [n−1, i] from each of the input values, wherein $n-1 \geq i \geq 0$.

10. A method comprising:

receiving two n-bit input values;

generating a plurality of select signals in hardware logic, wherein a select signal is generated by comparing a different proper subset of adjacent bits from each of the input values;

using each select signal to select, in hardware logic, a different, non-overlapping proper subset of adjacent bits from one of the input values to form at least one output value;

outputting the at least one output value, wherein the at least one output value comprises an n-bit maximum value and/or an n-bit minimum value selected from the two n-bit input values;

wherein the plurality of select signals comprise a select signal for each bit i of the n bits of an output value and wherein an $i^{th}$ bit of the output value is selected based on a comparison of bits [n−1, i] from each of the input values, wherein $n-1 \geq i \geq 0$; and wherein generating a plurality of select signals in hardware logic comprises:

generating a first plurality of initial signals by inputting an $i^{th}$ bit from each of the input values to one or more logic gates arranged to perform a comparison and output an initial signal indicating whether the $i^{th}$ bit from a first input n-bit value is greater than an $i^{th}$ bit from a second n-bit input value, generating a second plurality of initial signals by inputting an $i^{th}$ bit from each of the input values to one or more logic gates arranged to perform a comparison and output an initial signal indicating whether the $i^{th}$ bit from the first input n-bit value is equal to the $i^{th}$ bit from the second n-bit input value, for each of one or more groups of adjacent bits from each of the input signals, generating a plurality of intermediate signals by inputting the initial signals relating to the group of adjacent bits to one or more logic gates arranged to perform a comparison and output an intermediate signal indicating whether the group of bits from the first input n-bit value is greater than the group of bits from the second n-bit input value and an intermediate signal indicating whether the group of bits from the first input n-bit value is equal to the group of bits from the second n-bit input value, and for each of one or more further groups of adjacent bits from each of the input signals, generating one or two intermediate signals by inputting the initial and/or intermediate signals relating to the further group of adjacent bits to one or more logic gates arranged to perform a comparison and output an intermediate signal indicating whether the further group of bits from the first input n-bit value is greater than the further group of bits from the second n-bit input value and optionally an intermediate signal indicating whether the further group of bits from the first input n-bit value is equal to the further group of bits from the second n-bit input value;

wherein the select signal for the $i^{th}$ bit is the intermediate signal indicating whether the group of bits comprising bits (n−1,i) from the first input n-bit value is greater than the group of bits comprising bits (n−1,i) from the second n-bit input value, wherein the $(n-1)^{th}$ bit is a most significant bit in the value; and wherein the intermediate signals are generated logarithmically by generating intermediate signals for pairs of adjacent bits.

* * * * *